United States Patent [19]
Fong

[11] Patent Number: 5,345,111
[45] Date of Patent: Sep. 6, 1994

[54] HIGH-SPEED CURRENT SENSE AMPLIFIER

[75] Inventor: Vincent L. Fong, Fremont, Calif.

[73] Assignee: Hyundai Electronics America, San Jose, Calif.

[21] Appl. No.: 932,427

[22] Filed: Aug. 19, 1992

[51] Int. Cl.$^5$ .................... G01R 19/00; H03K 5/153
[52] U.S. Cl. ..................................... 307/350; 307/530
[58] Field of Search ............................... 307/350, 530

[56] References Cited

U.S. PATENT DOCUMENTS 4,935,649  6/1990  Bloker ................................. 307/530
5,057,718  10/1991  Proebsting ........................... 307/530

Primary Examiner—Richard A. Bertsch
Assistant Examiner—Roland G. McAndrews, Jr.
Attorney, Agent, or Firm—Townsend and Townsend Khourie and Crew

[57] ABSTRACT

A sense amplifier which is tolerant under differences in layout orientation, power supply variations and process variations is presented. The sense amplifier, operates between first and second power supplies and has two MOS transistors, each of which has a drain effectively connected to its gate to operate as functional diodes, connected in series between the first and second power supplies. The input terminal of the amplifier is connected to a node in series between the two MOS transistors and an inverter has its input node connected to the series node. The inverter's output node is coupled to the output terminal of the sense amplifier. The inverter, being responsive to a voltage at the input node, is set into one of two logic states so that a current at the sense amplifier's input terminal determines a logic state at the output terminal.

12 Claims, 2 Drawing Sheets

HIGH-SPEED CURRENT SENSE AMPLIFIER

BACKGROUND OF THE INVENTION

The present invention is related to integrated circuit sense amplifiers and, more particularly, to high-speed, current sense amplifier circuits.

Sense amplifiers are required for circuits which require the discrimination of signals into signals of different states, i.e., a clear logic one or logic zero. For example, these amplifiers are used in all integrated circuit memory products to distinguish the digital state of a memory cell. The sense amplifier circuits may be used to determine the difference in storage charges, cell currents or cell voltages. For any circuit in an integrated circuit device, it is desirable that the circuit be robust, i.e., capable of operating under a variety of conditions. It is typically desirable that a sense amplifier be capable of operating with variations in the power supply voltages. Furthermore, the number of transistors used in designing the sense amplifier circuit should be minimal in order to save space on the integrated circuit. The present invention offers such advantages.

SUMMARY OF THE INVENTION

The present invention provides for a sense amplifier operating between first and second power supplies. The sense amplifier has two MOS transistors, each of which has a drain effectively connected to its gate to operate as diode, connected in series between the first and second power supplies. An input terminal is connected to a node in series between the two MOS transistors and an inverter has its input node connected to the series node. The inverter's output node is coupled to the output terminal of the sense amplifier. The inverter, being responsive to a voltage at the input node, is set into one of two logic states so that a current at the sense amplifier's input terminal determines a logic state at the output terminal.

The sense amplifier also has switches which connect the two MOS transistors and which disconnect the series node and input terminal from one of the two power supplies in response to a signal on a control terminal to provide for an enablement function.

DESCRIPTION OF THE PREFERRED EMBODIMENT

Figure 1:
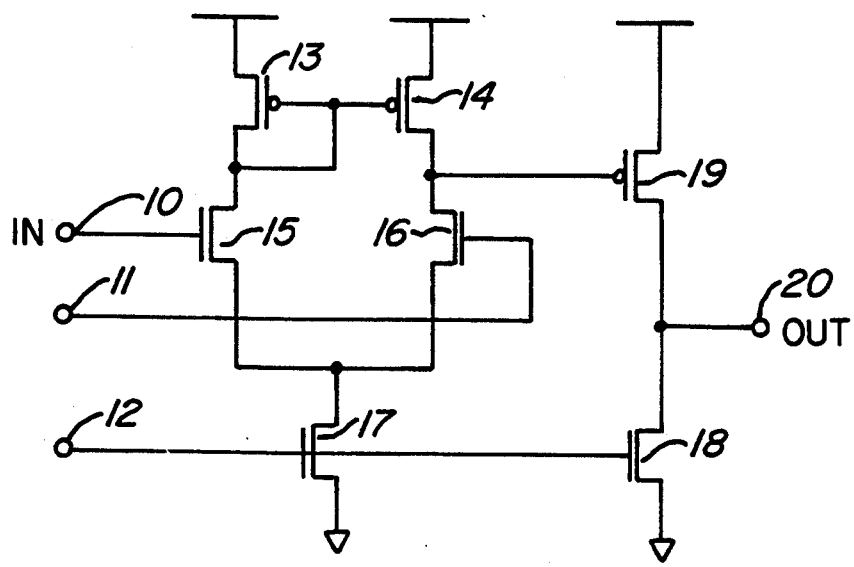
FIG. 1 is a circuit diagram of a sense amplifier circuit found in the prior art.

FIG. 1 shows a sense amplifier commonly known as a current mirror differential amplifier. This type of sense amplifier is commonly found in the prior art. The sense amplifier has an input terminal 10 for receiving an input signal and two reference voltage terminals 11 and 12. Typically, voltages of 2.5 volts for terminal 11 and 1.5 volts for terminal 12 are used.

This type of sense amplifier operates such that if a voltage at the input terminal 10 is higher than the reference voltage on terminal 11, the gate of the NMOS transistor 15 is at a higher voltage than the gate of the NMOS transistor 16. This pulls the node 22 lower than the voltage at the node 21. This, in turn, causes the PMOS transistor 19 to be turned on less strongly than the NMOS transistor 18. The result is that the output node 20 is pulled to a logic zero by the NMOS transistor 18.

Similarly, if the voltage at the input terminal 10 is lower than the voltage at the reference terminal 11, the node 22 is higher than the node 21. The PMOS transistor 19 is turned on more strongly than the NMOS transistor 18 and the output node 20 is pulled high by the action of the PMOS transistor 19.

However, this type of relatively simple circuit has some drawbacks. The typical normal operating range for the circuit is about 4 to 6 volts, i.e., the difference in the two voltage supplies is normally between 4 to 6 volts. Furthermore, mismatching of the current mirror transistors and common mode errors limit the sensitivity of this type of sense amplifier circuit. The loads on the transistors 15 and 16 are not quite matched due to the differing connections of the load transistors 13 and 14. When the power supply voltage $V_{CC}$ changes, for whatever reason, the changes in the currents through the transistors 13 and 14 do not match since the transistors 13 and 14 are not matched. Additionally, the required reference voltages for the terminals 11 and 12 increase the possibility of error and further limits effectiveness of this circuit under different electrical conditions. Finally, all the transistors 13, 15, 14, 16, and 17 operate in the active mode which further limits the operating range and speed of this sense amplifier circuit.

Figure 2:
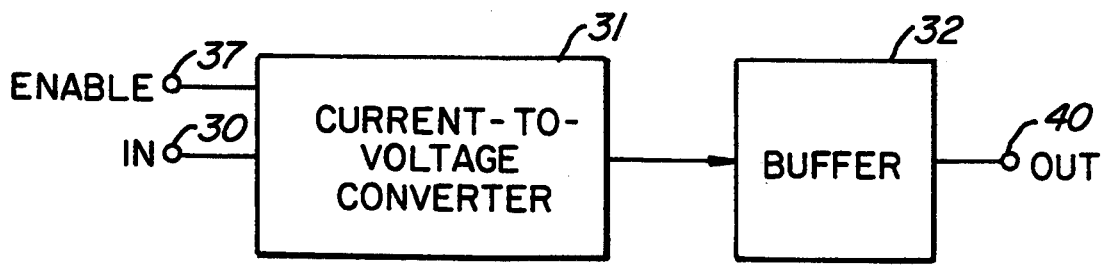
FIG. 2 is a block diagram of a differential circuit according to the present invention.

On the other hand, the present invention is designed to have transistors operating in the saturating mode for operations more tolerant of power supply variations and process variations. FIG. 2 shows the general configuration of the present invention. The present invention has an input terminal 30 to a current-to-voltage converter block 31, which, in turn, drives a buffer circuit 32 which generates the signal at an output terminal 40.

Figure 3:
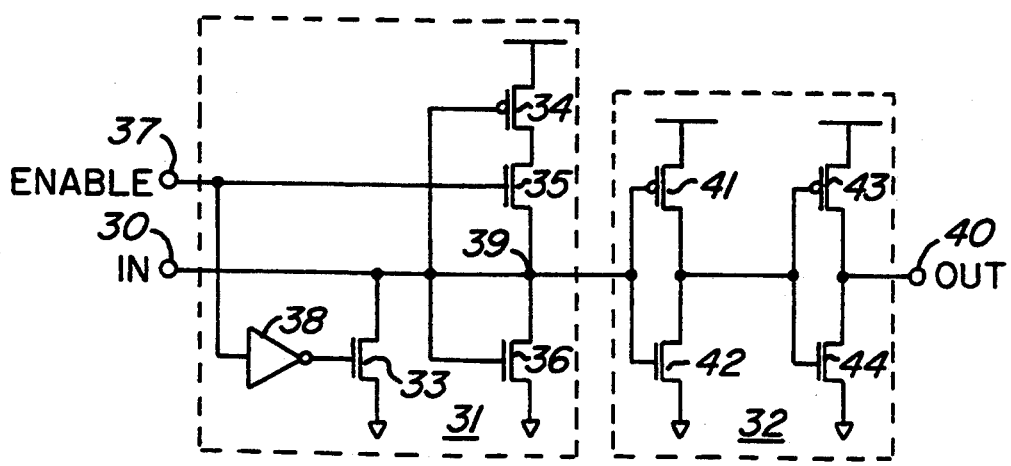
FIG. 3 is a circuit diagram of the circuit shown in FIG. 2.

FIG. 3 shows the details of the blocks 31 and 32. The control terminal 37 which receives an enable signal is connected to the gate terminal of a NMOS transistor 35 which is part of a set of serially connected transistors between the higher, more positive, voltage supply at $V_{CC}$ and the lower voltage supply at ground. A PMOS transistor 34 has its source connected to $V_{CC}$ and has its drain connected to the drain of the transistor 35. The source of the NMOS transistor 35 is connected to the drain of a NMOS transistor 36 which has its source connected to ground.

The control terminal 37 is also connected to an input node of an inverter 38 which has its output node connected to the gate of a NMOS transistor 33. The source of the NMOS transistor 33 is connected to ground and its drain connected to the input terminal 30 of the sense amplifier. The terminal 30 receives the signal to be "sensed." The drain of the transistor 33 is also connected to the gates of the PMOS transistor 34 and the NMOS transistor 36, and an output node 39 of the current-to-voltage converter block 31. The node 39 is formed by the source of the transistor 35 and drain of the transistor 36.

The NMOS transistors 33 and 35 operate as simple switches to enable the block 31 responsive to an enabling signal on the terminal 37. A logic high signal enables the block 31 and a low signal disables the block 31. The transistor 35 connects the two transistors 34 and 36, while the transistor 33 releases the output node 39 and input terminal 30 from ground.

The buffer 32 is formed by two serially connected inverters. The first inverter is formed by a pair of complementary transistors 41 and 42. The gates of the transistors 41 and 42 are connected to the output node 39 of the block 31. The source of the PMOS transistor 41 is connected to $V_{CC}$ and is the drain connected to the drain of the NMOS transistor 42. The source of the NMOS transistor is connected to ground. The output node of the first inverter formed by the common connection of the drains of the PMOS transistor 41 and NMOS transistor 42 are connected to the input node of the second inverter.

The PMOS transistor 43 and NMOS transistor 44 form the second inverter. The transistors 43, 44 are connected to the two power supplies in the same way as the transistors 41, 42 of the first inverter. The commonly connected gates of the transistors 43, 44 form the input node of the second inverter, and the common connection between the drains of the PMOS transistor 43 and NMOS transistor 44 form the output node to the output terminal 40 of the sense amplifier.

Figure 4:
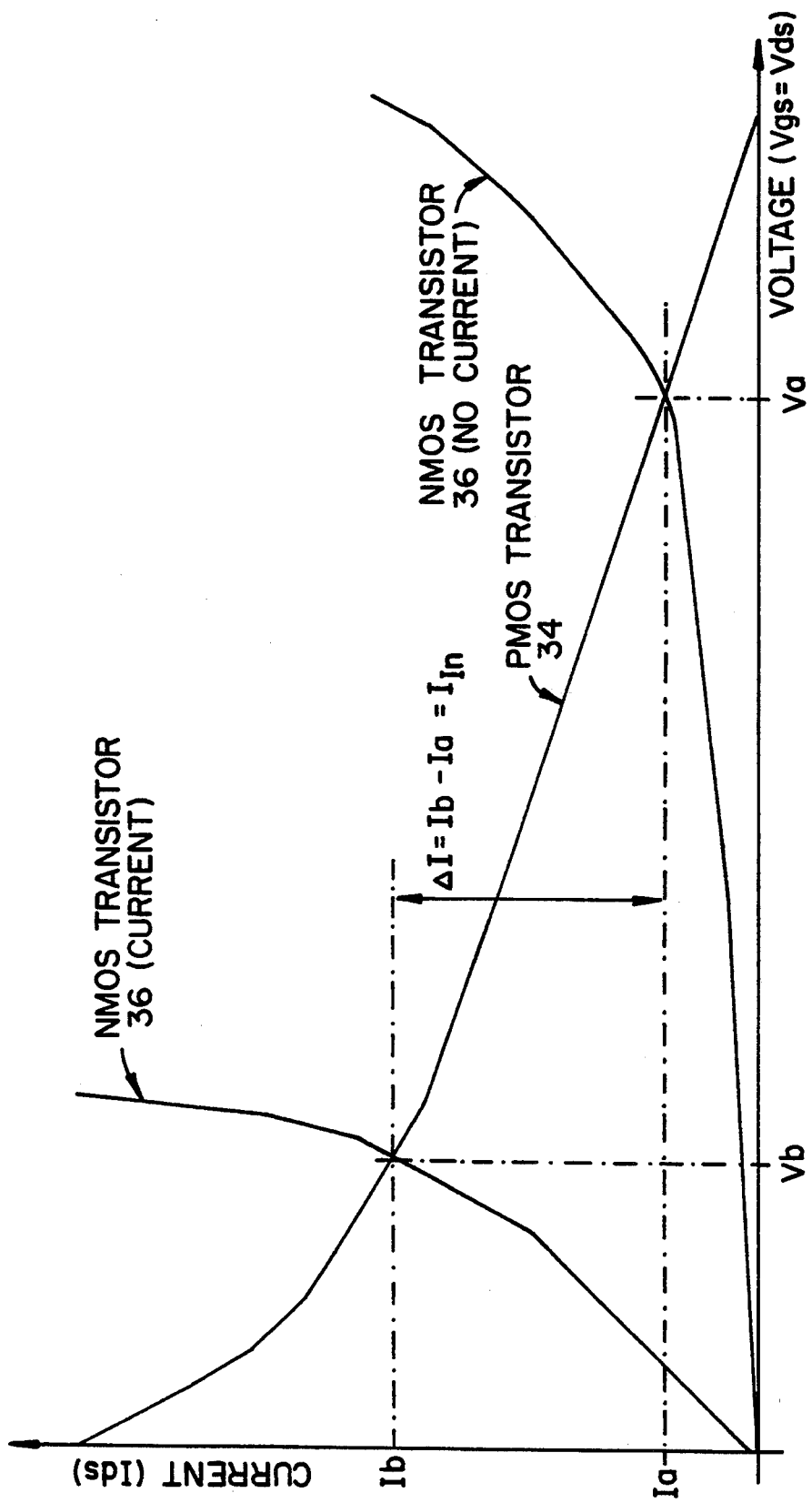
FIG. 4 shows the current/voltage graphs of various elements of the circuit shown in FIG. 3.

When the block 31 is enabled, the PMOS transistor 34 and NMOS transistor 36 operate in the saturation mode. The two transistors 34, 36 can be viewed as transistors connected in a diode configuration in which both the gate and drain of each transistor are at the same voltage. The current/voltage curves for both transistors 34 and 36 are shown in FIG. 4.

With no input current through the input terminal 30, the terminal 30 remains at a voltage Va. The transistor 34 has the same current Ia flowing through it. If a current $\Delta I$ is applied through the input terminal 30, point a moves to point b so that the input terminal 30 (and output node 39) is now at voltage Vb. The transistor 34 has a current Ib flowing through it. Thus, the output node 39, as can be seen in FIG. 4, swings in a voltage range responsive to the amount of current flowing through the input terminal 30.

The first inverter formed by the PMOS transistor 41 and NMOS transistor 42 is designed with a trip point between the voltage Va and Vb. In typical applications the trip point should be at the voltage where (Ia+Ib)/2, though the trip point may be different depending upon the particular application. The determination of a trip point is well-known to integrated circuit designers. By selecting the size and operating parameters of the two transistors which typically form an inverter, the inverter's trip point may be set. Therefore, the output from the block 31 is set one way or another into a logic one or a logic zero.

Because the operation of the circuit depends simply upon the transistors 34 and 36, which are more or less transistors in a diode-connected configuration, this circuit is very tolerant of differences in layout orientation, power supply variations and process variations. The current sense amplifier has a small number of elements and is functional over a wide range of supply voltage variations.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by the metes and bounds of the appended claims.

What is claimed is:

1. A sense amplifier connected between first and second power supplies and having an input terminal and an output terminal, said sense amplifier comprising
   first and second functional diode means connected in series between said first and second power supplies, said input terminal connected to a node in series between said first and second functional diode means, said first and second functional diode means each comprising a MOS transistor having a drain connected to a gate; and
   a first inverter having an input node connected to said series node and an output node connected to said output terminal, said first inverter responsive to a voltage at said input node being set into one of two logic states;
   whereby a current at said input terminal determines a logic state at said output terminal.

2. A sense amplifier as recited in claim 1 wherein said first functional diode means comprises a PMOS transistor having a first source/drain connected to said first power supply, said first power supply at a voltage higher than said second power supply; and said second functional diode means comprises a NMOS transistor having a first source/drain connected to said second power supply.

3. A sense amplifier as recited in claim 1 further comprising a second inverter having an input node connected to said output node of said first inverter and an output node connected to said output terminal.

4. A sense amplifier as recited in claim 3 wherein said first inverter has first and second MOS transistors, each MOS transistor having first and second source/drains, a gate, and operating characteristics, said first source/drain of said first MOS transistor connected to said first power supply, said first source/drain of said second MOS transistor connected to said second power supply, said second source/drains of said first and second MOS transistors connected in common to said output node, said gates of said MOS transistors connected to said input node, and said characteristics of said first and second MOS transistors being set such that said transistors switch at said predetermined point in said voltage range.

5. A sense amplifier as recited in claim 1 further comprising means having a control terminal and connected to said first and second functional diode means, for disabling said sense amplifier responsive to a signal on said control terminal.

6. A sense amplifier as recited in claim 5 wherein said disabling means comprises a first switch connected between said first and second functional diode means, said switch opening in response to said signal on said control terminal.

7. A sense amplifier as recited in claim 6 wherein said disabling means comprises a second switch connected to said series node, said second switch clamping said series node to one of said power supplies in response to said signal on said control terminal.

8. A sense amplifier as recited in claim 7 wherein said first and second switches comprise MOS transistors.

9. A sense amplifier connected between first and second power supplies and having an input terminal and an output terminal, said sense amplifier comprising
   first and second MOS transistors, each MOS transistor having first and second source/drains and a gate, said first source/drain of said first MOS transistor connected to said first power supply, said first source/drain of said second MOS transistor connected to said second power supply, said second source/drain of said first MOS transistor coupled to said second source/drain of said second MOS transistor and to said input terminal, said input terminal further connected to said gates of said first and second MOS transistors;

control terminal and a third MOS transistor, said third MOS transistor having a first source/drain connected to said second source/drain of said second MOS transistor and to said input terminal, a second source/drain connected to said second source/drain of said first MOS transistor and a gate coupled to said control terminal, whereby a signal on said control terminal switches said third MOS transistor off and on; and a first inverter having an input node connected to said input terminal and an output node coupled to said output terminal, said first inverter responsive to a voltage at said input node being set into one of two logic states;

whereby said first and second MOS transistors function as diodes and a current at said input terminal determines a logic state at said output terminal.

10. A sense amplifier as recited in claim 9 further comprising a fourth MOS transistor, said fourth MOS transistor having a first source/drain connected to said second power supply, a second source/drain connected to said input terminal, and a gate coupled to said control terminal whereby said fourth MOS transistor switches off and on in response to a signal on said control terminal.

11. A sense amplifier as recited in claim 10 further comprising an inverter connected between said control terminal and said gate of said fourth MOS transistor whereby said third MOS transistor switches on to connect said first and second MOS transistors and fourth MOS transistor switches off to disconnect said input terminal from said second power supply in response to a enable signal on said control terminal.

12. A sense amplifier as recited in claim 11 further comprising a second inverter, said second inverter having an input node connected to said output node of said first inverter and an output node connected to said output terminal.

* * * * *